(12) United States Patent
Njodzefon et al.

(10) Patent No.: US 12,388,097 B2
(45) Date of Patent: Aug. 12, 2025

(54) TEST SYSTEM, AIR MIXTURE LINE AND GAS CONTROL UNIT

(71) Applicant: Robert Bosch GmbH, Stuttgart (DE)

(72) Inventors: Jean-Claude Njodzefon, Renningen (DE); Kevin Widmann, Waiblingen (DE); Petra Wagner, Sindelfingen (DE); Thomas Hupfer, Weil der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 497 days.

(21) Appl. No.: 17/992,977

(22) Filed: Nov. 23, 2022

(65) Prior Publication Data

US 2023/0163328 A1 May 25, 2023

(30) Foreign Application Priority Data

Nov. 23, 2021 (DE) .......................... 102021213143.3

(51) Int. Cl.
| | |
|---|---|
| *H01M 8/04* | (2016.01) |
| *G01R 31/378* | (2019.01) |
| *H01M 8/04119* | (2016.01) |
| *H01M 8/12* | (2016.01) |

(52) U.S. Cl.
CPC ...... *H01M 8/04141* (2013.01); *G01R 31/378* (2019.01); *H01M 2008/1293* (2013.01)

(58) Field of Classification Search
CPC .................................. H01M 8/04141
See application file for complete search history.

(56) References Cited

U.S. PATENT DOCUMENTS

| | | |
|---|---|---|
| 2008/0197857 A1 | 8/2008 | Shin |
| 2008/0278183 A1 | 11/2008 | McClelland et al. |

FOREIGN PATENT DOCUMENTS

| | | |
|---|---|---|
| CN | 213660458 U | 7/2021 |

*Primary Examiner* — Olatunji A Godo
(74) *Attorney, Agent, or Firm* — Michael Best & Friedrich LLP

(57) ABSTRACT

A test system for characterizing solid oxide cells includes at least one gas control unit, at least one fuel gas mixture line, at least one hydrogen gas line, and at least one oxygen gas line. The at least one gas control unit includes at least three stack layers, and at least one hydration unit to humidify the uniform gas mixture. The hydration unit is disposed in a hydration layer of the at least three stack layers. At least one mixing chamber is directly connected in a gas-conductive manner to the fuel gas mixture line and the hydration unit, and is configured for producing the uniform gas mixture and is disposed in a mixing layer of the at least three stack layers. At least one test station for a solid oxide cell is disposed on a test layer of the at least three stack layers.

18 Claims, 7 Drawing Sheets

TEST SYSTEM, AIR MIXTURE LINE AND GAS CONTROL UNIT

BACKGROUND

A test system for characterizing solid oxide cells, preferably at temperatures from 500° C. to 850° C., comprising at least one gas control unit for producing a uniform fuel gas mixture for the solid oxide cells, comprising at least one fuel gas mixture line, comprising at least one hydrogen gas line and in particular comprising at least one oxygen gas line, wherein the at least one gas control unit comprises at least three stack layers, at least one hydration unit, which is configured to humidify the uniform gas mixture, is in particular directly connected in a gas-conductive manner to the at least one hydrogen gas line and/or to the at least one oxygen gas line and is disposed in a hydration layer of the at least three stack layers, at least one mixing chamber which is directly connected in a gas-conductive manner to the fuel gas mixture line and the hydration unit, is configured for producing the uniform gas mixture and is disposed in a mixing layer of the at least three stack layers and at least one test station for a solid oxide cell which is disposed on a test layer of the at least three stack layers, has already been proposed.

SUMMARY

The invention relates to a test system for characterizing solid oxide cells, preferably at temperatures from 500° C. to 850° C., comprising at least one gas control unit for producing a uniform fuel gas mixture for the solid oxide cells, comprising at least one fuel gas mixture line, comprising at least one hydrogen gas line and in particular comprising at least one oxygen gas line, wherein the at least one gas control unit comprises at least three stack layers, at least one hydration unit, which is configured to humidify the uniform gas mixture, is in particular directly connected in a gas-conductive manner to the at least one hydrogen gas line and/or to the at least one oxygen gas line and is disposed in a hydration layer of the at least three stack layers, at least one mixing chamber which is directly connected in a gas-conductive manner to the fuel gas mixture line and the hydration unit, is configured for producing the uniform gas mixture and is disposed in a mixing layer of the at least three stack layers and at least one test station for a solid oxide cell which is disposed on a test layer of the at least three stack layers.

It is proposed that the gas control unit comprise at least one further test station for at least one further solid oxide cell which is disposed on the test layer.

The test system is preferably configured for characterizing, in particular simultaneously and/or with a time delay, similar and different solid oxide cells, whereby in particular at least two solid oxide cells can be held in the test system at the same time. Individual or all of the solid oxide cells can be configured as anode-supported, metal-supported, cathode-supported and/or electrolyte-supported solid oxide cells, for example. The test system is preferably configured for characterizing at least two solid oxide cells at the same time. A solid oxide cell can be configured as a solid oxide fuel cell or a solid oxide electrolysis cell, for example. The solid oxide cell is preferably configured to convert chemical energy, in particular of a fuel gas, such as a natural gas, into electrical energy, preferably at temperatures of 450° C. to 850° C., particularly preferably at temperatures from 500° C. to 850° C. The solid oxide cells, in particular at least one solid oxide cell, preferably comprise a gas-tight electrolyte that is permeable to oxygen ions. The solid oxide cells, in particular at least one solid oxide cell, preferably comprise at least one multilayer electrode, in particular anode and/or cathode. The test system is preferably configured for characterizing solid oxide cells in a temperature range from 500° C. to 850° C. The test system can in particular be configured for characterizing solid oxide cells in a temperature range from 650° C. to 850° C. without a catalyst.

The test system can include at least one gas supply unit. The at least one fuel gas mixture line, the at least one hydrogen gas line and/or the at least one oxygen gas line can be assigned to the gas supply unit. The fuel gas mixture line is preferably configured for supplying a fuel gas mixture comprising carbon monoxide, carbon dioxide, methane, water vapor, hydrogen, nitrogen, methanol, diesel reformate and/or argon components to the gas control unit, in particular to the mixing chamber. The fuel gas mixture line is preferably configured for supplying a fuel gas mixture comprising at least carbon monoxide, at least carbon dioxide and at least methane components, in particular with water vapor, to the gas control unit, in particular to the mixing chamber. The hydrogen gas line is preferably configured for supplying hydrogen, in particular with water vapor, to the gas control unit, preferably to the hydration unit and/or in particular to the mixing chamber. The oxygen gas line is preferably configured for supplying oxygen, in particular with water vapor, to the gas control unit, preferably to the hydration unit and/or in particular to the mixing chamber.

The gas control unit is preferably made of a ceramic, preferably a full ceramic, in particular an oxide ceramic, such as preferably aluminum oxide, or also silicon nitride, aluminum nitride, zirconium oxide and/or silicon carbide. The stack layers of the gas control unit are preferably made of a ceramic, in particular an oxide ceramic, such as preferably aluminum oxide, or also silicon nitride, aluminum nitride, zirconium oxide and/or silicon carbide.

The hydration unit can comprise at least one bubbler, in particular at least one vapor pressure saturator, at least one evaporator or at least one reaction chamber. The at least one evaporator and/or the at least one bubbler can be integrally formed with at least one of the at least one fuel gas mixture line, the at least one hydrogen gas line and/or the at least one oxygen gas line. The hydration unit preferably comprises at least one reaction chamber, in particular for reacting hydrogen and oxygen. The hydration unit, in particular the reaction chamber, is preferably directly connected in a gas-conductive manner to the at least one hydrogen gas line and to the at least one oxygen gas line. The hydration unit, in particular the reaction chamber, is preferably directly connected in a gas-conductive manner to the mixing chamber, in particular on a different side than that to which the at least one hydrogen gas line and/or the at least one oxygen gas line is/are connected to the hydration unit, in particular the reaction chamber. The hydration unit preferably comprises at least one catalyst, preferably at least one noble metal catalyst. The at least one catalyst is preferably disposed in the at least one reaction chamber to catalyze the reaction of hydrogen and oxygen. The hydration unit is preferably disposed in the gas control unit. The hydration unit is preferably disposed in exactly one stack layer, in particular the hydration layer, of the gas control unit. The hydration layer is preferably configured differently than the mixing layer. The hydration layer is preferably configured differently than the test layer. The hydration layer and the mixing layer are preferably directly adjacent stack layers of the gas control unit. The hydration layer is preferably disposed on a side of the mixing layer which faces away from the test layer. The test layer preferably forms a penultimate layer of the gas control unit in the stacking direction, in particular on a test side of the mixing layer. The stacking direction is preferably oriented at least substantially perpendicular to the largest outer surfaces of the individual stack layers. The expression "substantially perpendicular" here is in particular intended to mean an orientation of a direction relative to a reference direction, wherein, in particular viewed in a projection plane, the direction and the reference direction enclose an angle of 90° and the angle has a maximum deviation of in particular less than 8°, advantageously less than 5° and particularly advantageously less than 2°. The hydration layer preferably forms a penultimate layer of the gas control unit in the stacking direction, in particular on a hydration side of the mixing layer. The mixing layer is preferably disposed between the hydration layer and the test layer. The hydration unit is preferably disposed upstream of the mixing chamber with respect to a gas flow from the at least one fuel gas mixture line, the at least one hydrogen gas line and/or the at least one oxygen gas line to the mixing chamber, is in particular connected to at least one of the at least one hydrogen gas line and/or the at least one oxygen gas line and/or is integrated into at least one of the at least one hydrogen gas line and/or the at least one oxygen gas line. The test layer and the mixing layer are preferably disposed spaced apart from one another by at least one stack layer. Respective adjacent stack layers are preferably connected to one another. Individual stack layers can be connected to one another in a gas-tight manner by strips, preferably gold strips, or mica strips, glass strips and/or ceramic strips, for example, which are at least 2 mm, preferably at least 5 mm, wide, in particular within a sealing region defined by the strips. Individual stack layers can be connected to one another in a gas-tight manner by strips, preferably gold strips, or mica strips, glass strips and/or ceramic strips, for example, which are preferably 100-500 µm thick, in particular within a sealing region defined by the strips.

Because of the configuration according to the invention of the test system, an advantageously uniform fuel gas mixture can be achieved for uniform characterization of at least two solid oxide cells at the same time under the same conditions. Data sets relating to characteristics of the solid oxide cells can in particular be measured more quickly and more consistently. Advantageously reliable data sets can be achieved, in particular for solid oxide cells measured under advantageously same conditions. Advantageously uniform test conditions can in particular be achieved, which advantageously provide comparable data sets for solid oxide cells. An advantageously uniformly humidified fuel gas mixture can be achieved. An advantageous environmental standard can be achieved by simultaneously measuring a plurality of solid oxide cells.

It is further proposed that the test system comprise an exhaust gas line for discharging exhaust gas from the at least one test station and the at least one further test station, wherein the at least one exhaust gas line is disposed at least partly in at least one stack layer of the at least three stack layers different from the test layer. The at least one exhaust gas line is preferably disposed at least partly in the at least one mixing layer. The at least one exhaust gas line is preferably disposed at least partly in the at least one hydration layer. The at least one exhaust gas line preferably extends through the at least one mixing layer, in particular along the stacking direction. The at least one exhaust gas line preferably extends through the at least one hydration layer, in particular along the stacking direction. The at least one exhaust gas line is preferably disposed spaced apart from the at least one test layer. The at least one exhaust gas line is preferably disposed in the mixing layer spaced apart from the mixing chamber. The at least one exhaust gas line is preferably disposed in the hydration layer spaced apart from the reaction chamber. The at least one exhaust gas line is preferably configured to discharge exhaust gas from the at least one test station and from the at least one further test station. An advantageously uniformly temperature-controlled exhaust gas line can be achieved. In particular risks of unfavorable exhaust gas flows can advantageously be reduced. Advantageously uniform test conditions can be achieved for all test stations. Recondensation effects can advantageously be reduced.

It is also proposed that the at least one test station and the at least one further test station be disposed equidistantly from the mixing chamber at least in relation to a gas path from the mixing chamber to the respective test stations. All of the test stations are preferably disposed equidistantly from the mixing chamber in relation to a gas path from the mixing chamber to the respective test stations. All of the test stations are preferably disposed symmetrically to one another on the test layer around a gas outlet from the mixing chamber. The mixing chamber preferably comprises the gas outlet. The gas outlet is preferably disposed centrally on an outer side of the mixing chamber which faces toward the test layer. A gas path from the mixing chamber, in particular from the gas outlet of the mixing chamber, to each test station is preferably configured to be the same length. A gas path from the mixing chamber, in particular from the gas outlet of the mixing chamber, to each test station is preferably configured to have the same shape. An advantageously uniform supply of the uniform gas mixture to the test stations can be achieved.

It is further proposed that the gas control unit comprise at least one, preferably at least two, additional test stations which are disposed on the test layer. All of the test stations are preferably configured, in particular shaped, the same way. The at least one test station is preferably configured in the same way as the at least one further test station. The at least one additional test station is preferably configured in the same way as the at least one test station and/or as the at least one further test station. Each test station preferably comprises a gas inlet which, in relation to a gas path from the mixing chamber, is disposed equidistantly from the at least one mixing chamber, in particular from the gas outlet of the at least one mixing chamber. An advantageously cost-efficient characterization of solid oxide cells can be achieved. Advantageous reliable statistics from measurements relating to solid oxide cells can be achieved.

It is also proposed that the gas control unit comprise at least one further stack layer, in particular a feed gas distribution layer, which is disposed between the mixing layer and the test layer and delimits a feed gas line which connects the at least one test station and the at least one further test station equidistantly at least with respect to a gas path to the at least one mixing chamber. The at least one feed gas distribution layer is preferably disposed between the at least one mixing layer and the at least one test layer. The at least one feed gas distribution layer is preferably disposed directly adjacent to the mixing layer. The at least one feed gas distribution layer is preferably disposed spaced apart from the test layer by at least one stack layer, in particular an exhaust gas collector layer. The at least one feed gas distribution layer can be disposed directly adjacent to the at least one test layer. The at least one feed gas distribution layer can be disposed spaced apart from the mixing layer by at least one stack layer, in particular an exhaust gas collector layer. The gas outlet of the mixing chamber is preferably connected in a gas-conductive manner to the feed gas distribution layer, in particular to the feed gas line. The feed gas line is preferably configured to a symmetrical shape around a central feed gas connector recess for uniformly connecting the test stations to the mixing chamber with respect to the gas path from the mixing chamber to the test stations. The feed gas line is preferably connected to the mixing chamber at the feed gas connector recess, in particular by a straight gas line. An advantageously uniform supply of the uniform fuel gas mixture to the test stations can be achieved. It is in particular possible to achieve an advantageously uniform temperature control of the uniform gas mixture in the feed gas distribution layer.

It is further proposed that the gas control unit comprise at least one further stack layer, in particular a, in particular the already mentioned, exhaust gas collector layer, which is disposed between the mixing layer and the test layer and delimits an exhaust gas section line which connects the at least one test station and the at least one further test station equidistantly at least in relation to a gas path to the at least one exhaust gas line. The at least one exhaust gas collector layer is preferably disposed between the at least one mixing layer and the at least one test layer. The at least one exhaust gas collector layer is preferably disposed directly adjacent to the test layer. The at least one exhaust gas collector layer is preferably disposed spaced apart from the mixing layer by at least one stack layer, in particular the at least one feed gas distribution layer. The at least one exhaust gas collector layer can be disposed directly adjacent to the at least one mixing layer. The at least one exhaust gas collector layer can be spaced apart from the test layer by at least one stack layer, in particular the at least one feed gas distribution layer. The at least one exhaust gas line is preferably connected in a gas-conductive manner to the exhaust gas collector layer, in particular to the exhaust gas section line. The exhaust gas section line is preferably configured to a symmetrical shape about a central exhaust gas connector recess for uniformly connecting the test stations to the exhaust gas line with respect to the gas path and/or an effective gas path, in particular a combination of the length of the gas path and the geometry of the gas path, from the test stations to the exhaust gas line. The exhaust gas section line is preferably connected to the test stations at exhaust gas recesses which are spaced apart from the exhaust gas connector recess, in particular by a straight gas line. An advantageously uniform discharge of exhaust gas from the test stations can be achieved. It is in particular possible to achieve an advantageously uniform temperature control of the exhaust gas, as a result of which in particular backflow effects can advantageously be reduced.

It is also proposed that the gas control unit comprise at least one further stack layer, in particular a gas distribution layer, which is disposed between the mixing layer and the test layer and delimits a feed gas line which connects the at least one test station and the at least one further test station equidistantly at least with respect to a gas path to the at least one mixing chamber and delimits an exhaust gas section line which connects the at least one test station and the at least one further test station equidistantly at least in relation to a gas path to the at least one exhaust gas line. The gas distribution layer is preferably configured as a one-piece variant of the exhaust gas collector layer with the feed gas distribution layer. "In one piece" is in particular intended to be understood to mean formed in one piece, whereby the one piece is preferably produced from a single blank, a mass and/or a casting, preferably from a single solid material in a milling process and/or sintering process. The feed gas line can be delimited by the gas distribution layer at a different level than the exhaust gas section line, in particular with respect to the stacking direction. The feed gas line can be delimited by the gas distribution layer at the same level as the exhaust gas section line, in particular with respect to the stacking direction. The feed gas line and the exhaust gas line are preferably disposed spaced apart from one another by at least 5 mm of material of the gas distribution layer. The feed gas distribution layer and/or the exhaust gas collector layer can be configured in one piece with the test layer. An advantageously cost-efficient gas control unit can be achieved. It is in particular possible to achieve an advantageously compact gas control unit.

It is also proposed that the test system comprise at least one air mixture line for supplying the at least one test station and the at least one further test station with an air mixture, which comprises at least one common rail unit for uniformly supplying the at least one test station and the at least one further test station with the air mixture. The air mixture line is preferably disposed entirely outside the gas control unit. The air mixture is preferably at a pressure of at least 1.5 bar. The air mixture is preferably at a pressure between 1.5 bar to 5 bar.

The common rail unit preferably comprises at least one high-pressure pump. The high-pressure pump can actively be regulated to a pressure. For pressure control in unregulated pumps, the common rail unit can comprise at least one pressure control valve. The air mixture is preferably configured as a mixture of at least nitrogen and at least oxygen. It is possible to achieve an advantageously uniform air mixture supply to the test stations, in particular for a cathode supply to the solid oxide cells.

An air mixture line of a test system according to the invention is proposed as well. An advantageous compatibility of the air mixture line to the gas control unit can be achieved. It is in particular possible to achieve an advantageous interchangeability of air mixture lines.

Proceeding from a test system for characterizing solid oxide cells, preferably at temperatures from 500° C. to 850° C., comprising at least one gas control unit for producing a uniform fuel gas mixture for the solid oxide cells, comprising at least one fuel gas mixture line, comprising at least one hydrogen gas line and comprising at least one oxygen gas line, wherein the at least one gas control unit comprises at least three stack layers, at least one hydration unit, which is directly connected in a gas-conductive manner to the at least one hydrogen gas line and/or to the at least one oxygen gas line to humidify the uniform gas mixture and is disposed in a hydration layer of the at least three stack layers, at least one mixing chamber which is directly connected in a gas-conductive manner to the fuel gas mixture line and the hydration unit, is configured for producing the uniform gas mixture and is disposed in a mixing layer of the at least three stack layers and at least one test station for a solid oxide cell which is disposed on a test layer of the at least three stack layers, it is also proposed that the at least one hydration unit comprise a reaction chamber for reacting hydrogen and oxygen and at least one catalyst, preferably a noble metal catalyst, which is disposed upstream of the at least one mixing chamber with respect to a gas flow and is directly connected in a gas-conductive manner to the at least one hydrogen gas line and to the at least one oxygen gas line.

The test system is preferably configured for characterizing solid oxide cells in a temperature range from 500° C. to 850° C.

The catalyst is preferably configured as a platinum catalyst, in particular in the form of at least one mesh. The catalyst is preferably at least partially, preferably at least for the most part, made of platinum.

Because of the configuration according to the invention of the test system, an advantageously uniform fuel gas mixture can be achieved for uniform characterization of solid oxide cells under the same conditions. It is in particular possible to achieve an advantageously uniformly humidified fuel gas mixture. In particular a risk of coking, in particular of the gas control unit, can be reduced.

It is further proposed that the test system comprise an exhaust gas line for discharging exhaust gas from the at least one test station, wherein the at least one exhaust gas line is disposed at least partly in at least one stack layer of the at least three stack layers different from the test layer. The at least one exhaust gas line can be the same as the already mentioned exhaust gas line. The at least one exhaust gas line is preferably configured to discharge exhaust gas from the at least one test station. An advantageously uniformly temperature-controlled exhaust gas line can be achieved. In particular risks of unfavorable exhaust gas flows can advantageously be reduced. Advantageously uniform test conditions can be achieved for all test stations.

A gas control unit of a test system according to the invention is proposed as well. An improved availability of the gas control unit can be achieved, in particular for measuring a plurality of solid oxide cells at the same time. An advantageously short production time, in particular delivery time, of the gas control unit can be achieved, in particular for measuring a plurality of solid oxide cells at the same time. Advantageously standardized gas control units can be achieved, which in particular make it possible to achieve advantageously comparable measurement conditions. Standardized measurement conditions can advantageously be achieved. It is in particular possible to achieve advantageously reliable, in particular comparable, data sets from different gas control units. An advantageously high safety standard for gas control units can be achieved.

The test system(s) according to the invention, the air mixture line according to the invention and/or the gas control unit according to the invention is/are not intended to be limited to the above-described application and embodiment. In order to fulfill a herein described function, the test system according to the invention, the air mixture line according to the invention and/or the gas control unit according to the invention can in particular comprise a number of individual elements, components and units that deviates from a herein mentioned number. Moreover, for the ranges of values indicated in this disclosure, values lying within the mentioned limits are also intended to be considered disclosed and usable as desired.

BRIEF DESCRIPTION OF THE DRAWINGS

Further advantages will become apparent from the following description of the drawing. The drawing shows two design examples of the invention. The drawing, the description and the claims contain numerous features in combination. The person skilled in the art will expediently also consider the features individually and combine them into meaningful further combinations.

The figures show.

DETAILED DESCRIPTION

Figure 1:
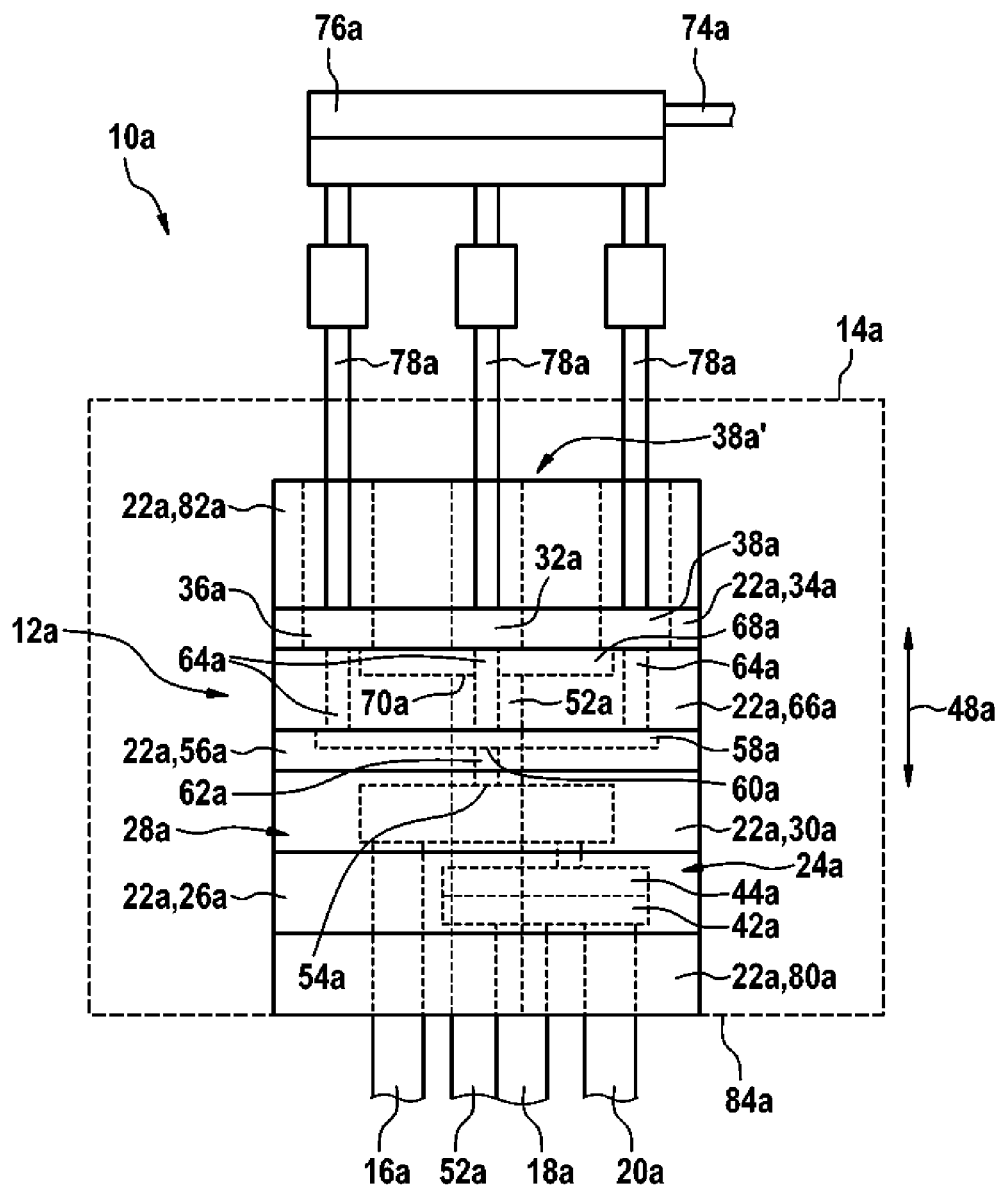
FIG. 1 a test system according to the invention comprising a gas control unit according to the invention and an air mixture line according to the invention in a schematic illustration, FIG. 2 the gas control unit according to the invention in a schematic partially transparent illustration, FIG. 3 a part of the gas control unit according to the invention in a schematic illustration, FIG. 4 a part of the gas control unit according to the invention in a schematic illustration, FIG. 5 a part of the gas control unit according to the invention in a schematic illustration, FIG. 6 the air mixture line according to the invention in a schematic illustration and FIG. 7 a part of an alternative gas control unit according to the invention of an alternative test system in a schematic illustration.

FIG. 1 shows a test system 10a. The test system 10a is configured for characterizing solid oxide cells. The test system 10a is configured for characterizing solid oxide cells at temperatures from 500° C. to 850° C. The test system 10a can be configured for characterizing solid oxide cells at temperatures from 650° C. to 850° C., in particular without a catalyst 44a.

The test system 10a comprises a gas control unit 12a. The gas control unit 12a is configured for producing a uniform fuel gas mixture for the solid oxide cells. The test system 10a comprises a furnace 14a. The gas control unit 12a is disposed in the furnace 14a. The test system 10a comprises a fuel gas mixture line 16a. The test system 10a comprises a hydrogen gas line 18a. The test system 10a comprises an oxygen gas line 20a.

As an example, the gas control unit 12a here comprises seven stack layers 22a.

The gas control unit 12a comprises a hydration unit 24a. The hydration unit 24a is configured to humidify the uniform gas mixture. In this example, the hydration unit 24a is directly connected in a gas-conductive manner to the at least one hydrogen gas line 18a and to the at least one oxygen gas line 20a. The hydration unit 24a is disposed in a hydration layer 26a of the seven stack layers 22a.

The gas control unit 12a comprises a mixing chamber 28a. The mixing chamber 28a is directly connected in a gas-conductive manner to the fuel gas mixture line 16a. The mixing chamber 28a is directly connected in a gas-conductive manner to the hydration unit 24a.

The mixing chamber 28a is configured for producing the uniform gas mixture. The mixing chamber 28a is disposed in a mixing layer 30a of the seven stack layers 22a.

The gas control unit 12a comprises a test station 32a, 36a, 38a, 38'a. The test station 32a, 36a, 38a, 38'a is configured for a solid oxide cell. The test station 32a, 36a, 38a, 38'a is disposed on a test layer 34a of the seven stack layers 22a.

The gas control unit 12a comprises at least one further test station 32a, 36a, 38a, 38'a. The further test station 32a, 36a, 38a, 38'a is configured for a solid oxide cell. The further test station 32a, 36a, 38a, 38'a is disposed on the test layer 34a of the seven stack layers 22a. The gas control unit 12a comprises two additional test stations 32a, 36a, 38a, 38'a. The additional test stations 32a, 36a, 38a, 38'a are configured for one respective solid oxide cell. The additional test stations 32a, 36a, 38a, 38'a are disposed on the test layer 34a of the seven stack layers 22a. All of the test stations 32a, 36a, 38a, 38a' are preferably configured, in particular shaped, the same way. The test station 32a, 36a, 38a, 38a' is configured in the same way as the further test station 32a, 36a, 38a, 38a'. The additional test stations 38a, 38'a are configured in the same way as the test station 32a, 36a, 38a, 38a' and as the further test station 32a, 36a, 38a, 38a'.

Figure 2:
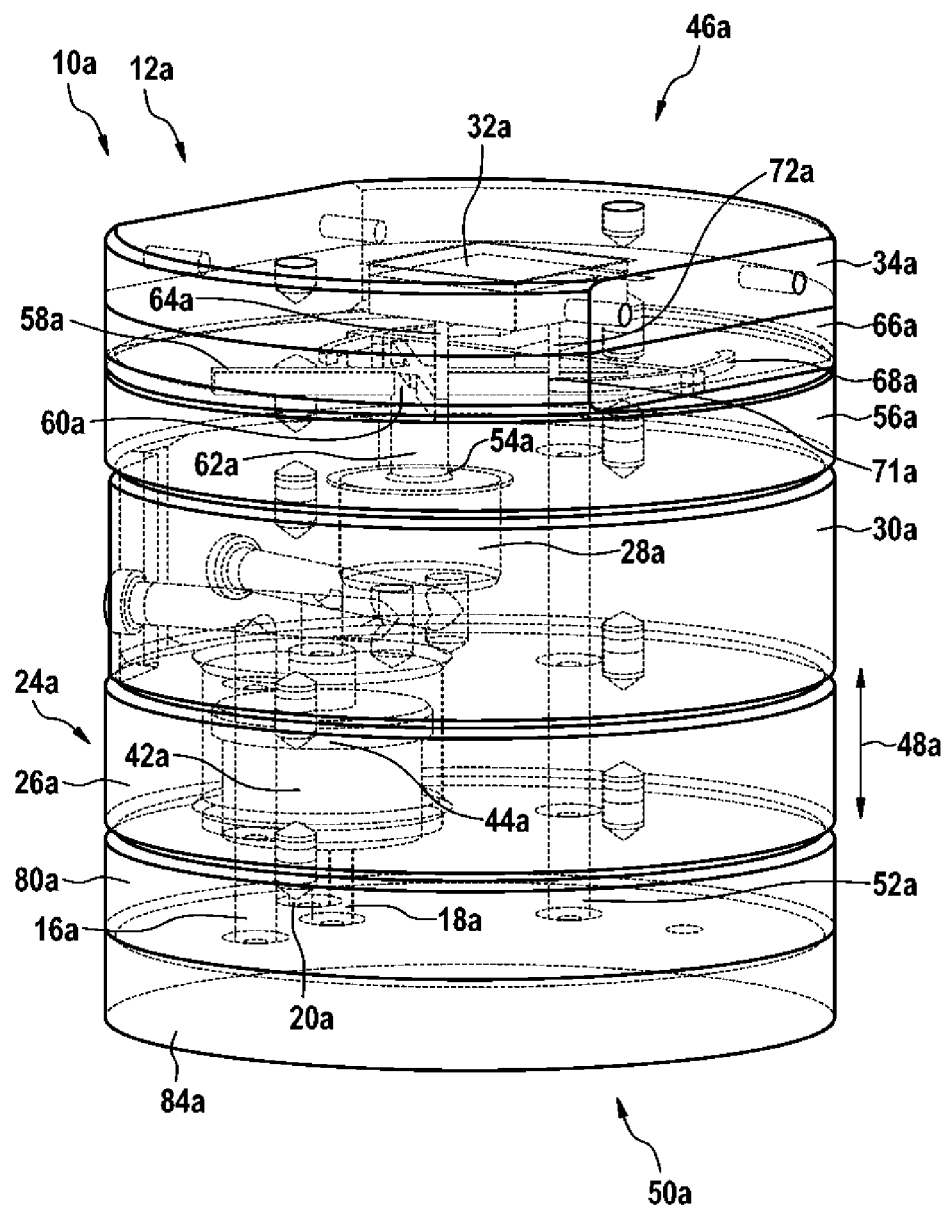

Each test station 32a, 36a, 38a, 38'a comprises a gas inlet 40a (see FIG. 2). The gas inlets 40a are disposed equidistantly from the at least one mixing chamber 28a, in particular from a gas outlet 54a of the mixing chamber 28a, in relation to a gas path from the mixing chamber 28a. Each test station 32a, 36a, 38a, 38'a comprises a gas outlet 41a.

The test system 10a is configured for characterizing similar and different solid oxide cells simultaneously and with a time delay. Individual or all of the solid oxide cells can be configured as anode-supported, metal-supported, cathode-supported and/or electrolyte-supported solid oxide cells, for example. The test system 10a is configured for characterizing up to four solid oxide cells at the same time. A solid oxide cell can be configured as a solid oxide fuel cell or a solid oxide electrolysis cell, for example.

The test system 10a is configured for characterizing solid oxide cells in a temperature range from 500° C. to 850° C.

The fuel gas mixture line 16a is configured for supplying a fuel gas mixture comprising at least carbon monoxide, at least carbon dioxide and at least methane components to the gas control unit 12a, in particular to the mixing chamber 28a. The hydrogen gas line 18a is configured for supplying hydrogen to the gas control unit 12a, in particular to the hydration unit 24a. The oxygen gas line 20a is configured for supplying oxygen to the gas control unit 12a, in particular to the hydration unit 24a.

The gas control unit 12a is made of a ceramic, preferably a full ceramic, in particular an oxide ceramic, such as aluminum oxide. The stack layers 22a of the gas control unit 12a are preferably in particular made of the ceramic, in particular the oxide ceramic, such as aluminum oxide.

The hydration unit 24a comprises a reaction chamber 42a, in particular for reacting hydrogen and oxygen. The reaction chamber 42a is directly connected in a gas-conductive manner to the at least one hydrogen gas line 18a and to the at least one oxygen gas line 20a.

The hydration unit 24a, in particular the reaction chamber 42a, is preferably directly connected in a gas-conductive manner to the mixing chamber 28a, in particular on a different side than that to which the at least one hydrogen gas line 18a and/or the at least one oxygen gas line 20a is/are connected to the hydration unit 24a, in particular the reaction chamber 42a.

The hydration unit 24a comprises a catalyst 44a, in particular a noble metal catalyst. The catalyst 44a is disposed in the reaction chamber 42a to catalyze the reaction of hydrogen and oxygen. The hydration unit 24a is preferably disposed in the gas control unit 12a. The hydration unit 24a is disposed in exactly one stack layer 22a, in particular in the hydration layer 26a, of the gas control unit 12a. The catalyst 44a is configured as a platinum catalyst, in particular in the form of at least one mesh. The hydration layer 26a is configured differently than the mixing layer 30a. The hydration layer 26a is configured differently than the test layer 34a. The hydration layer 26a and the mixing layer 30a are preferably directly adjacent stack layers 22a of the gas control unit 12a. The hydration layer 26a is disposed on a side of the mixing layer 30a which faces away from the test layer 34a.

The test layer 34a is a penultimate layer of the gas control unit 12a in the stacking direction 48a, in particular on a test side 46a of the mixing layer 30a. The stacking direction 48a is oriented perpendicular to the largest outer surfaces of the individual stack layers 22a. The hydration layer 26a is a penultimate layer of the gas control unit 12a in the stacking direction 48a, in particular on a hydration side 50a of the mixing layer 30a. The test layer 34a and the mixing layer 30a are disposed spaced apart from one another by at least one stack layer 22a.

The hydration side 50a of the mixing layer 30a is a side of the mixing layer 30a which faces toward the hydrogen gas line 18a, the fuel gas mixture line 16a and the oxygen gas line 20a. The test side 46a of the mixing layer 30a is a side of the mixing layer 30a which faces away from the hydrogen gas line 18a, the fuel gas mixture line 16a and the oxygen gas line 20a. The mixing layer 30a is disposed between the hydration layer 26a and the test layer 34a.

The hydration unit 24a is disposed upstream of the mixing chamber 28a with respect to a gas flow from the fuel gas mixture line 16a, the hydrogen gas line 18a and the oxygen gas line 20a to the mixing chamber 28a.

The hydration unit 24a is connected to the hydrogen gas line 18a and the oxygen gas line 20a with respect to a gas flow from the fuel gas mixture line 16a, the hydrogen gas line 18a and the oxygen gas line 20a to the mixing chamber 28a.

Respective adjacent stack layers 22a are connected to one another. Individual stack layers 22a are connected to one another in a gas-tight manner by gold strips 88a which are at least 100, in particular at most 500 μm, thick, in particular within a sealing region 86a defined by the gold strips 88a. Individual stack layers 22a are connected to one another in a gas-tight manner by gold strips 88a which are at least 2 mm wide, in particular within a sealing region 86a defined by the gold strips 88a.

The test system 10a comprises an exhaust gas line 52a for discharging exhaust gas from the test station 32a, 36a, 38a, 38a', the further test station 32a, 36a, 38a, 38a' and the additional test stations 32a, 36a, 38a, 38a' (see FIG. 2). The exhaust gas line 52a is partly disposed in at least one stack layer 22a of the seven stack layers 22a different from the test layer 34a. The exhaust gas line 52a is partly disposed in the mixing layer 30a.

The exhaust gas line 52a is partly disposed in the at least one hydration layer 26a. The exhaust gas line 52a extends through the mixing layer 30a, in particular along the stacking direction 48a. The exhaust gas line 52a extends through the at least one hydration layer 26a, in particular along the stacking direction 48a. The exhaust gas line 52a is disposed spaced apart from the at least one test layer 34a. The exhaust gas line 52a is disposed in the mixing layer 30a spaced apart from the mixing chamber 28a.

The exhaust gas line 52a is disposed in the hydration layer 26a spaced apart from the reaction chamber 42a. The exhaust gas line 52a is configured to discharge exhaust gas from the test station 32a, 36a, 38a, 38a', from the further test station 32a, 36a, 38a, 38a' and from the additional test stations 32a, 36a, 38a, 38a'. The test station 32a 36a, 38a, 38a', the further test station 32a, 36a, 38a, 38a' and the additional test stations 32a, 36a, 38a, 38a' are disposed equidistantly from the mixing chamber 28a in relation to a gas path from the mixing chamber 28a to the respective test stations 32a, 36a, 38a, 38'a.

All of the test stations 32a, 36a, 38a, 38'a are disposed equidistantly from the mixing chamber 28a in relation to a gas path from the mixing chamber 28a to the respective test stations 32a, 36a, 38a, 38'a. All of the test stations 32a, 36a, 38a, 38'a are disposed symmetrically to one another on the test layer 34a around a gas outlet 54a from the mixing chamber 28a. The mixing chamber preferably 28a comprises the gas outlet 54a. The gas outlet 54a is preferably disposed centrally on an outer side of the mixing chamber 28a which faces toward the test layer 34a. A gas path from the mixing chamber 28a, in particular from the gas outlet 54a of the mixing chamber 28a, to each test station 32a, 36a, 38a, 38'a is configured to be the same length. The gas path from the mixing chamber 28a, in particular from the gas outlet 54a of the mixing chamber 28a, to each test station 32a, 36a, 38a, 38'a is configured to have the same shape (see FIG. 4).

Figure 4:
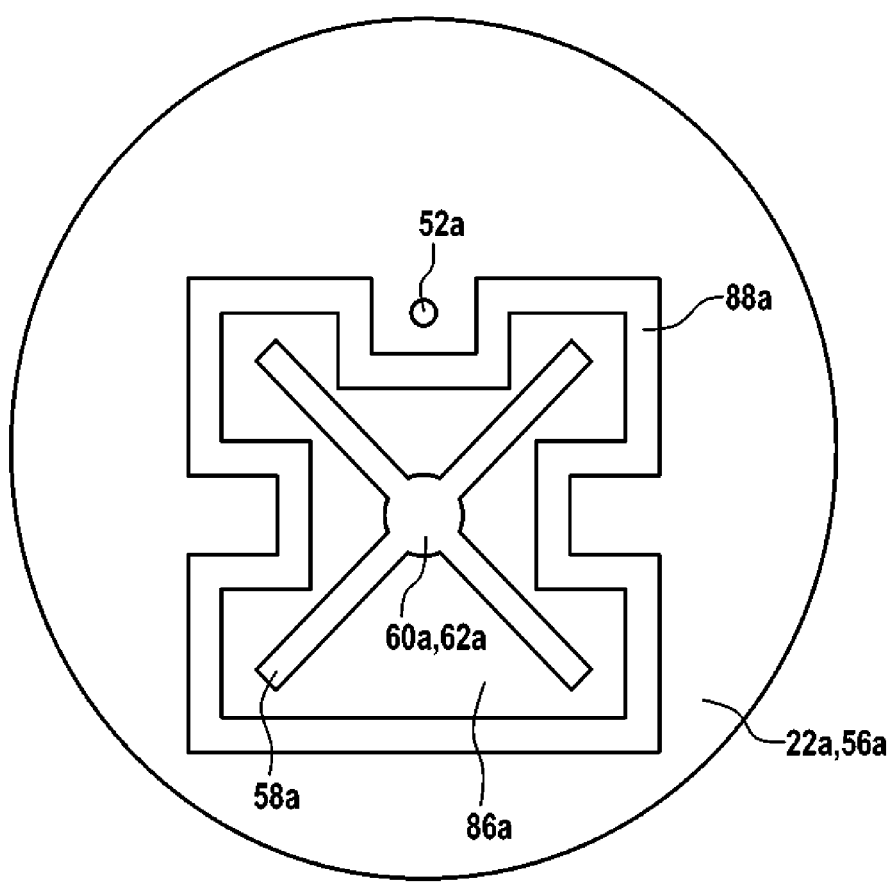

The gas control unit 12a comprises at least one further stack layer 22a, in particular a feed gas distribution layer 56a (see FIG. 4). The feed gas distribution layer 56a is disposed between the mixing layer 30a and the test layer 34a. The feed gas distribution layer 56a delimits a feed gas line 58a. The feed gas line 58a connects the test stations 32a, 36a, 38a, 38'a equidistantly in relation to a gas path to the at least one mixing chamber 28a.

The feed gas distribution layer 56a is disposed directly adjacent to the mixing layer 30a. The feed gas distribution layer 56a is disposed spaced apart from the test layer 34a by at least one stack layer 22a, in particular an exhaust gas collector layer 66a. The gas outlet 54a of the mixing chamber 28a is connected in a gas-conductive manner to the feed gas distribution layer 56a, in particular to the feed gas line 58a. The feed gas line 58a is configured such that it is limited to a symmetrical shape around a central feed gas connector recess 60a for uniformly connecting the test stations 32a, 36a, 38a, 38'a to the mixing chamber 28a with respect to the gas path from the mixing chamber 28a to the test stations 32a, 36a, 38a, 38'a. The feed gas line 58a is configured such that it is limited to an X-shape in the feed gas distribution layer 56a (see plan view along the stacking direction 48a in FIG. 4). The feed gas line 58a is connected to the mixing chamber 28a at the feed gas connector recess 60a, in particular by a straight gas line 62a which extends in the stacking direction 48a. The feed gas line 58a is connected at ends which are spaced apart from the feed gas connector recess 60a to a respective test station 32a, 36a, 38a, 38'a, in particular by a straight gas line 64a which extends in the stacking direction 48a. The feed gas line 58a is configured in the feed gas distribution layer 56a without limitation in a stacking direction 48a. The feed gas line 58a is configured in the feed gas distribution layer 56a with a limitation of at least 95% in a stacking direction 48a.

The gas control unit 12a comprises a further stack layer 22a, in particular the exhaust gas collector layer 66a. The exhaust gas collector layer 66a is disposed between the mixing layer 30a and the test layer 34a. The exhaust gas collector layer 66a delimits an exhaust gas section line 68a. The exhaust gas section line 68a connects the test stations 32a, 36a, 38a, 38'a equidistantly at least in relation to a gas path to the exhaust gas line 52a.

The exhaust gas collector layer 66a is disposed between the mixing layer 30a and the test layer 34a. The exhaust gas collector layer 66a is disposed directly adjacent to the test layer 34a. The exhaust gas collector layer 66a is disposed spaced apart from the mixing layer 30a by at least one stack layer 22a, in particular the at least one feed gas distribution layer 56a. The exhaust gas line 52a is connected in a gas-conductive manner to the exhaust gas section line 68a. The exhaust gas section line 68a is configured to a shape around a central exhaust gas connector recess 70a for uniformly connecting the test stations 32a, 36a, 38a, 38'a to the exhaust gas line 52a with respect to the gas path from the test stations 32a, 36a, 38a, 38'a to the exhaust gas line 52a (see plan view along the stacking direction 48a in FIG. 3). The exhaust gas section line 68a is connected to the test stations 32a, 36a, 38a, 38'a at exhaust gas recesses 71a which are spaced apart from the exhaust gas connector recess 70a, in particular by a straight gas line 72a.

The test system 10a comprises an air mixture line 74a (see FIG. 1). The air mixture line 74a is configured for supplying the test stations 32a, 36a, 38a, 38'a with an air mixture. The air mixture line 74a comprises a common rail unit 76a. The common rail unit 76a is configured for uniformly supplying the test stations 32a, 36a, 38a, 38'a with the air mixture. The air mixture line 74a is disposed entirely outside the gas control unit 12a. The air mixture is configured as a mixture of at least nitrogen and at least oxygen. The common rail unit 76a is connected to the individual test stations 32a, 36a, 38a, 38'a by four gas lines 78a.

The gas control unit 12a comprises a base layer 80a for connecting a metallic furnace bottom 84a to the gas control unit 12a. The gas control unit 12a comprises a cover layer 82a for covering and for keeping the test stations 32a, 36a, 38a, 38'a at a defined temperature during a test operation.

The exhaust gas line 52a extends through the mixing layer 30a, through the hydration layer 26a, through the base layer 80a, through the feed gas distribution layer 56a, partly through the exhaust gas collector layer 66a, always in the stacking direction 48a.

Figure 3:
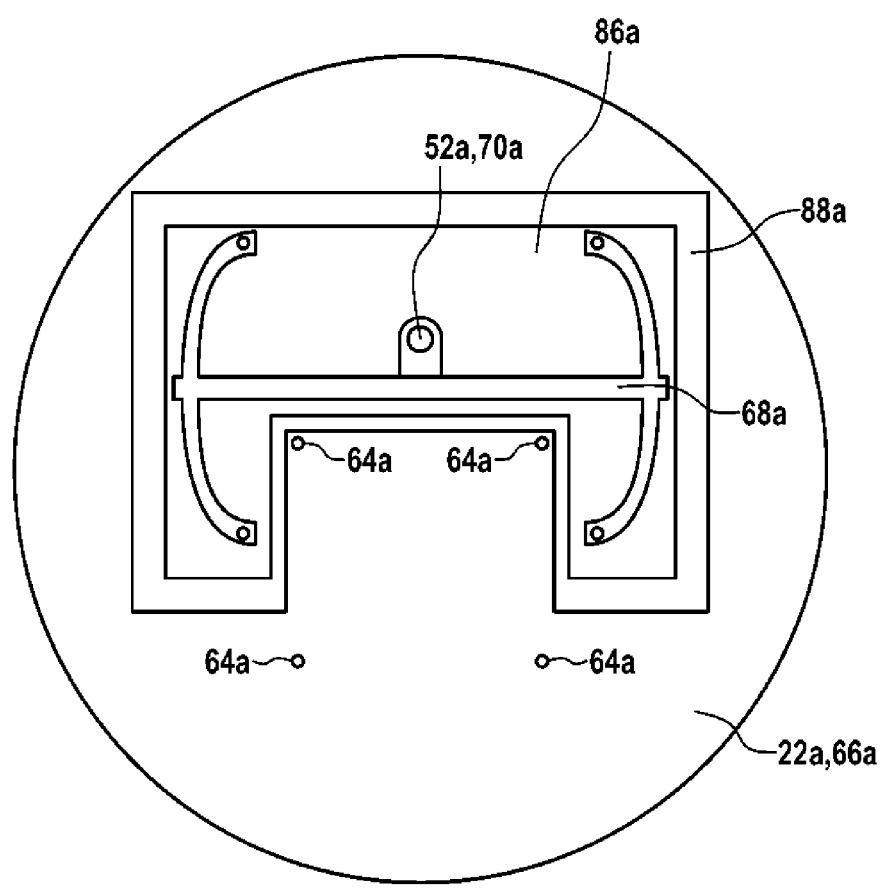
Figure 5:
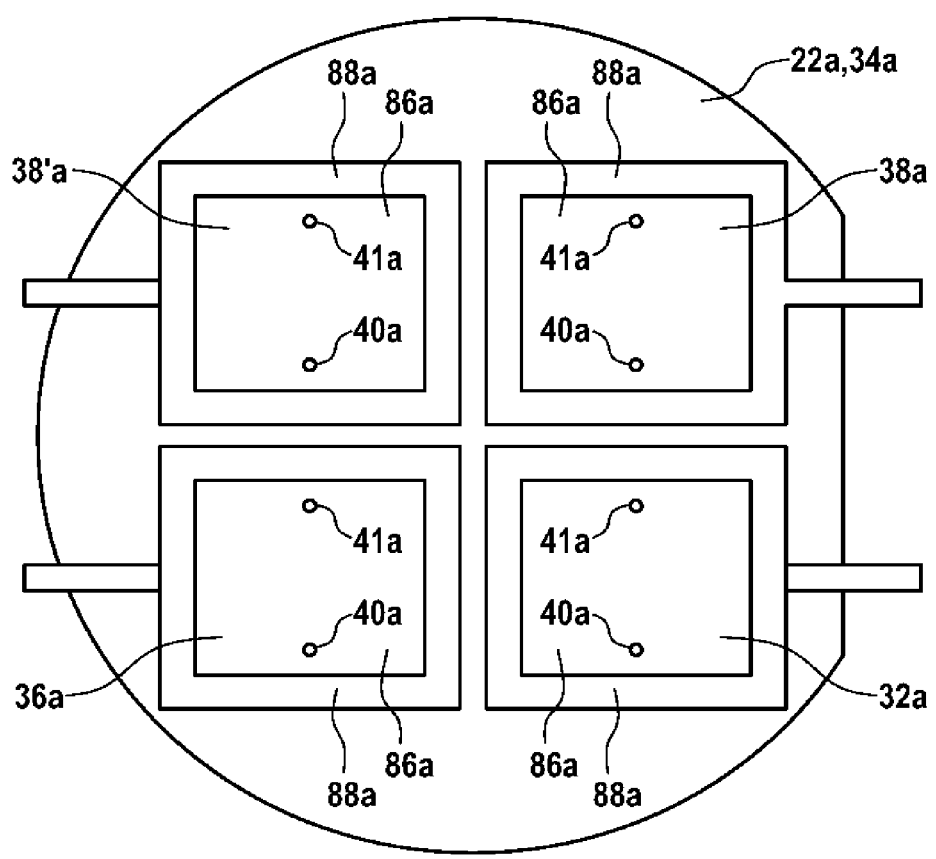
Figure 6:
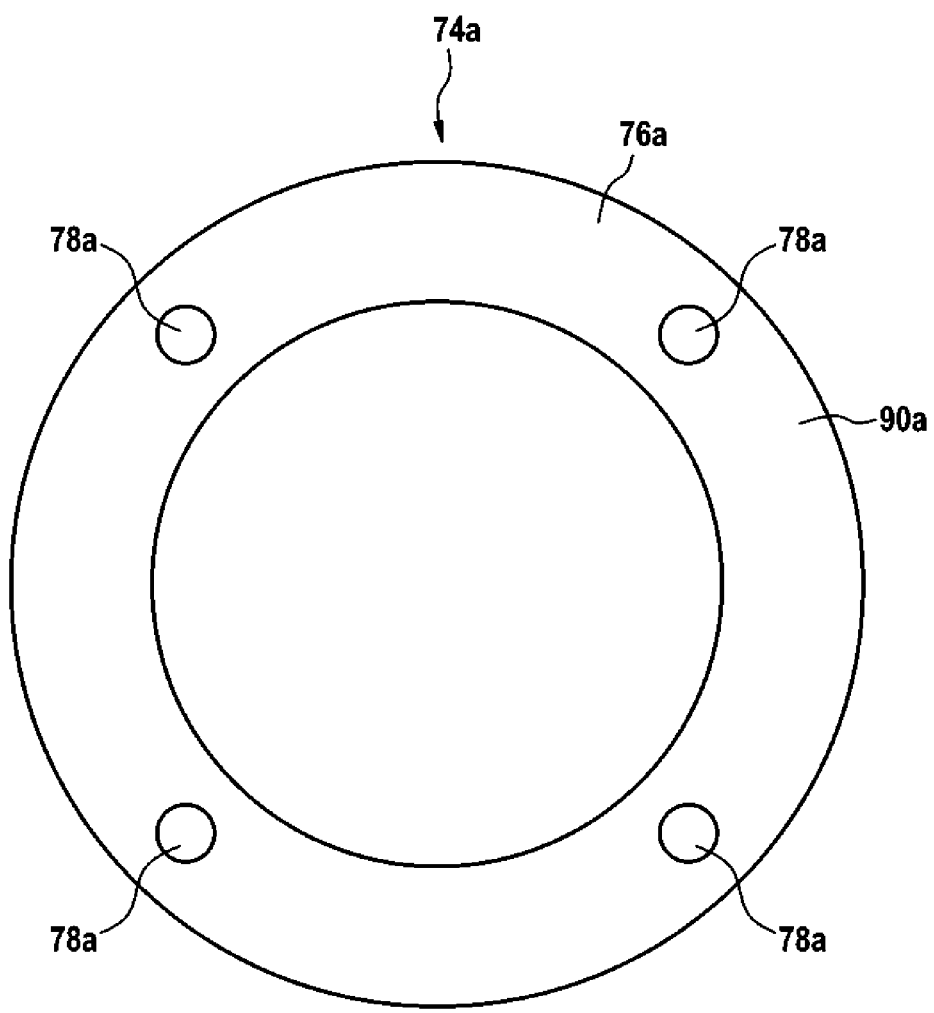

FIG. 2 in particular shows the gas control unit 12a in a partially transparent illustration with only one of the test stations 32a, 36a, 38'a, 38'a for the sake of clarity. FIG. 3 in particular shows the exhaust gas collector layer 66a in a view along the stacking direction 48a. FIG. 4 in particular shows the feed gas distribution layer 56a in a view along the stacking direction 48a. The feed gas distribution layer 56a and the exhaust gas collector layer 66a are in particular connected to the next stack layer 22a at an open side of the exhaust gas section line 68a and the feed gas line 58a by 5 mm thick gold strips 88a to form a gas-tight sealing region 86a defined within by the gold strips 88a. FIGS. 3 and 4 are schematic and not uniformly dimensioned and serve only to provide better understanding. FIG. 5 in particular shows the test layer 34a in a view along the stacking direction 48a with all four test stations 32a, 36a, 38a, 38'a in an example of an arrangement. FIG. 6 in particular shows the common rail unit 76a in a view along the stacking direction 48a. The common rail unit 76a delimits an outer gas flow ring 90a for creating the uniform air mixture.

Figure 7:
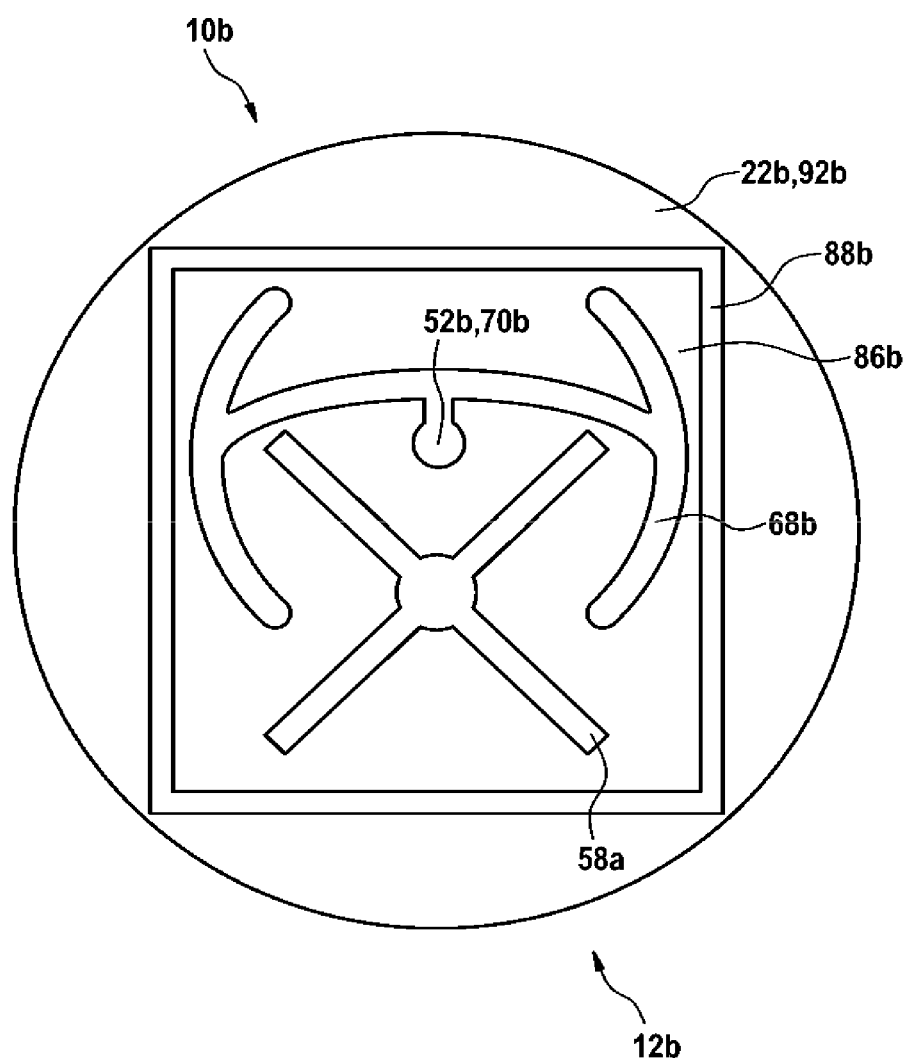

FIG. 7 shows a further design example of the invention. The following descriptions and the drawings are limited substantially to the differences between the design examples, wherein, with respect to identically named components, in particular with respect to components having identical reference signs, reference can in principle also be made to the drawings and/or the description of the other design examples, in particular of FIGS. 1 to 6. To distinguish between the design examples, the letter a has been placed after the reference signs of the design example in FIGS. 1 to 6. In the design example of FIG. 7, the letter a has been replaced by the letter b.

FIG. 7 shows an alternative test system 10b. The test system 10b comprises a gas control unit 12b. The gas control unit 12b comprises a stack layer 22b, in particular a gas distribution layer 92b. The gas distribution layer 92b is configured as a one-piece variant of the exhaust gas collector layer 66a with the feed gas distribution layer 56a of the previous design example.

The gas distribution layer 92*b* is disposed between a mixing layer 30*b* and a test layer 34*b*. The gas distribution layer 92*b* delimits a feed gas line 58*b*. The feed gas line 58*b* connects four test stations 32*b*, 36*b*, 38*b*, 38*b*' equidistantly at least in relation to a gas path to a mixing chamber 28*b*. The gas distribution layer 92*b* delimits an exhaust gas section line 68*b*.

The exhaust gas section line 68*b* connects the four test stations 32*b*, 36*b*, 38*b*, 38*b*' to the exhaust gas line 52*b* equidistantly with respect to an effective gas path, in particular a combination of the length of the gas path and the geometry of the gas path, from the test stations 32*b*, 36*b*, 38*b*, 38*b*' to the exhaust gas line 52*b*.

The feed gas line 58*b* is delimited by the gas distribution layer 92*b* at the same level as the exhaust gas section line 68*b*, in particular with respect to the stacking direction 48*b*. The feed gas line 58*b* and the exhaust gas line 52*b* are disposed spaced apart from one another by at least 5 mm of material of the gas distribution layer 92*b*.

The exhaust gas section line 68*b* is configured to a symmetrical shape about a central exhaust gas connector recess 70*b* for uniformly connecting the test stations 32*b*, 36*b*, 38*b*, 38*b*' to an exhaust gas line 52*b* with respect to an effective gas path, in particular a combination of the length of the gas path and the geometry of the gas path, from the test stations 32*b*, 36*b*, 38*b*, 38*b*' to the exhaust gas line 52*b*. FIG. 7 in particular shows the gas distribution layer 92*b* in a plan view along the stacking direction 48*b*.

The invention claimed is:

1. A test system for characterizing solid oxide cells, the test system comprising: at least one gas control unit (12*a*; 12*b*) for producing a uniform fuel gas mixture for the solid oxide cells, the gas control unit including at least one fuel gas mixture line (16*a*; 16*b*), at least one hydrogen gas line (18*a*; 18*b*), and at least one oxygen gas line (20*a*; 20*b*), wherein the at least one gas control unit (12*a*; 12*b*) further includes at least three stack layers (22*a*; 22*b*), at least one hydration unit (24*a*; 24*b*), which is configured to humidify the uniform gas mixture, is directly connected in a gas-conductive manner to the at least one hydrogen gas line (18*a*; 18*b*) and/or to the at least one oxygen gas line (20*a*; 20*b*), and is disposed in a hydration layer (26*a*; 26*b*) of the at least three stack layers (22*a*; 22*b*), at least one mixing chamber (28*a*; 28*b*) which is directly connected in a gas-conductive manner to the fuel gas mixture line (16*a*; 16*b*) and the hydration unit (24*a*; 24*b*), is configured for producing the uniform gas mixture and is disposed in a mixing layer (30*a*; 30*b*) of the at least three stack layers (22*a*; 22*b*), and at least one test station (32*a*, 36*a*, 38*a*, 38*a*'; 32*b*, 36*b*, 38*b*, 38*b*') for a solid oxide cell which is disposed on a test layer (34*a*; 34*b*) of the at least three stack layers (22*a*; 22*b*), wherein the gas control unit (12*a*; 12*b*) comprises at least one further test station (32*a*, 36*a*, 38*a*, 38*a*'; 32*b*, 36*b*, 38*b*, 38*b*') for at least one further solid oxide cell which is disposed on the test layer (34*a*; 34*b*).

2. The test system according to claim 1, further comprising an exhaust gas line (52*a*; 52*b*) for discharging exhaust gas from the at least one test station (32*a*, 36*a*, 38*a*, 38*a*'; 32*b*, 36*b*, 38*b*, 38*b*') and the at least one further test station (32*a*, 36*a*, 38*a*, 38*a*'; 32*b*, 36*b*, 38*b*, 38*b*'), wherein the exhaust gas line (52*a*; 52*b*) is at least partly disposed in at least one stack layer (22*a*; 22*b*) of the at least three stack layers (22*a*; 22*b*) different from the test layer (34*a*; 34*b*).

3. The test system according to claim 1, wherein the at least one test station (32*a*, 36*a*, 38*a*, 38*a*'; 32*b*, 36*b*, 38*b*, 38*b*') and the at least one further test station (32*a*, 36*a*, 38*a*, 38*a*'; 32*b*, 36*b*, 38*b*, 38*b*') are disposed equidistantly from the mixing chamber (28*a*; 28*b*) at least in relation to a gas path from the mixing chamber (28*a*; 28*b*) to the respective test stations (32*a*, 36*a*, 38*a*, 38*a*'; 32*b*, 36*b*, 38*b*, 38*b*').

4. The test system according to claim 1, wherein the gas control unit (12*a*; 12*b*) comprises at least one additional test station (32*a*, 36*a*, 38*a*, 38*a*'; 32*b*, 36*b*, 38*b*, 38*b*') which is disposed on the test layer (34*a*; 34*b*).

5. The test system according to claim 1, wherein the gas control unit (12*a*; 12*b*) comprises at least one further stack layer (22*a*; 22*b*), which is disposed between the mixing layer (30*a*; 30*b*) and the test layer (34*a*; 34*b*) and delimits a feed gas line (58*b*) which connects the at least one test station (32*a*, 36*a*, 38*a*, 38*a*'; 32*b*, 36*b*, 38*b*, 38*b*') and the at least one further test station (32*a*, 36*a*, 38*a*, 38*a*'; 32*b*, 36*b*, 38*b*, 38*b*') equidistantly at least in relation to a gas path to the at least one mixing chamber (28*a*; 28*b*).

6. The test system according to claim 2, wherein the gas control unit (12*a*; 12*b*) comprises at least one further stack layer (22*a*; 22*b*), which is disposed between the mixing layer (30*a*; 30*b*) and the test layer (34*a*; 34*b*) and delimits an exhaust gas section line (68*a*; 68*b*) which connects the at least one test station (32*a*, 36*a*, 38*a*, 38*a*'; 32*b*, 36*b*, 38*b*, 38*b*') and the at least one further test station (32*a*, 36*a*, 38*a*, 38*a*'; 32*b*, 36*b*, 38*b*, 38*b*') equidistantly at least in relation to a gas path to the at least one exhaust gas line (52*a*; 52*b*).

7. The test system at least according to claim 2, wherein the gas control unit (12*b*) comprises at least one further stack layer (22*b*), which is disposed between the mixing layer (30*b*) and the test layer (34*b*) and delimits a feed gas line (58*b*) which connects the at least one test station (32*b*, 36*b*, 38*b*, 38*b*') and the at least one further test station (32*b*, 36*b*, 38*b*, 38*b*') equidistantly at least in relation to a gas path to the at least one mixing chamber (28*b*) and which delimits an exhaust gas section line (68*b*) which connects the at least one test station (32*b*, 36*b*, 38*b*, 38*b*') and the at least one further test station (32*b*, 36*b*, 38*b*, 38*b*') equidistantly at least in relation to a gas path to the at least one exhaust gas line (52*b*).

8. The test system according to claim 1, further comprising at least one air mixture line (74*a*; 74*b*) for supplying the at least one test station (32*a*, 36*a*, 38*a*, 38*a*'; 32*b*, 36*b*, 38*b*, 38*b*') and the at least one further test station (32*a*, 36*a*, 38*a*, 38*a*'; 32*b*, 36*b*, 38*b*, 38*b*') with an air mixture, the at least one air mixture line (74*a*; 74*b*) including at least one common rail unit (76*a*; 76*b*) for uniformly supplying the at least one test station (32*a*, 36*a*, 38*a*, 38*a*'; 32*b*, 36*b*, 38*b*, 38*b*') and the at least one further test station (32*a*, 36*a*, 38*a*, 38*a*'; 32*b*, 36*b*, 38*b*, 38*b*') with the air mixture.

9. An air mixture line of a test system (10*a*; 10*b*) according to claim 8.

10. The test system according to claim 1, wherein the at least one hydration unit (24*a*; 24*b*) comprises a reaction chamber (42*a*; 42*b*) for reacting hydrogen and oxygen and at least one catalyst (44*a*; 44*b*), which reaction chamber (42*a*; 42*b*) is disposed upstream of the at least one mixing chamber (28*a*; 28*b*) with respect to a gas flow and is directly connected in a gas-conductive manner to the at least one hydrogen gas line (18*a*; 18*b*) and to the at least one oxygen gas line (20*a*; 20*b*).

11. The test system according to claim 10, further comprising an exhaust gas line (52*a*; 52*b*) for discharging exhaust gas from the at least one test station (32*a*, 36*a*, 38*a*, 38*a*'; 32*b*, 36*b*, 38*b*, 38*b*'), wherein the exhaust gas line (52*a*; 52*b*) is at least partly disposed in at least one stack layer (22*a*; 22*b*) of the at least three stack layers (22*a*; 22*b*) different from the test layer (34*a*; 34*b*).

12. A gas control unit (12*a*; 12*b*) of a test system (10*a*; 10*b*) according to claim 1.

13. The test system according to claim 1, wherein the solid oxide cells are at temperatures from 500° C. to 850° C.

14. The test system according to claim 4, wherein the gas control unit (12*a*; 12*b*) comprises at least two additional test stations (32*a*, 36*a*, 38*a*, 38*a*'; 32*b*, 36*b*, 38*b*, 38*b*') which are disposed on the test layer (34*a*; 34*b*).

15. The test system according to claim 5, wherein the at least one further stack layer (22*a*; 22*b*) is a feed gas distribution layer (56*a*; 56*b*).

16. The test system according to claim 6, wherein the at least one further stack layer (22*a*; 22*b*) is an exhaust gas collector layer (66*a*; 66*b*).

17. The test system according to claim 7, wherein the at least one further stack layer (22*a*; 22*b*) is a gas distribution layer (92*b*).

18. The test system according to claim 10, wherein the at least one catalyst (44*a*; 44*b*) is a noble metal catalyst.

* * * * *